(12) United States Patent
Omekanda et al.

(10) Patent No.: US 10,655,583 B2
(45) Date of Patent: May 19, 2020

(54) OPTIMUM CURRENT DRIVE FOR A ACTUATOR CONTROL

(71) Applicant: GM GLOBAL TECHNOLOGY OPERATIONS LLC, Detroit, MI (US)

(72) Inventors: Avoki M. Omekanda, Rochester, MI (US); Chandra S. Namuduri, Troy, MI (US); Suresh Gopalakrishnan, Troy, MI (US); Thomas W. Nehl, Shelby Township, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 189 days.

(21) Appl. No.: 15/127,017

(22) PCT Filed: Mar. 19, 2015

(86) PCT No.: PCT/US2015/021389
§ 371 (c)(1),
(2) Date: Sep. 17, 2016

(87) PCT Pub. No.: WO2015/143109
PCT Pub. Date: Sep. 24, 2015

(65) Prior Publication Data
US 2017/0179865 A1 Jun. 22, 2017

Related U.S. Application Data

(60) Provisional application No. 61/968,098, filed on Mar. 20, 2014, provisional application No. 61/968,127, filed on Mar. 20, 2014.

(51) Int. Cl.
*F02M 51/06* (2006.01)
*F16K 31/06* (2006.01)
(Continued)

(52) U.S. Cl.
CPC .......... *F02M 51/061* (2013.01); *F02D 41/20* (2013.01); *F02D 41/402* (2013.01);
(Continued)

(58) Field of Classification Search
CPC ............ F02D 41/20; F02D 2041/2034; F02D 2041/2044; F02D 2041/2058;
(Continued)

(56) References Cited

U.S. PATENT DOCUMENTS 5,381,297 A   1/1995  Weber
5,831,809 A   11/1998 Schmitz
(Continued)

FOREIGN PATENT DOCUMENTS

DE    34 37 053 C2    6/1985
DE    196 43 788 A1   5/1998
(Continued)

OTHER PUBLICATIONS

A. M. Pawlak, Transient Finite Element Modeling of Solenoid Actuators, IEEE Transactions on Magnetics, Jan. 1988, 270-273, vol. 24, No. 1.
(Continued)

*Primary Examiner* — Shawki S Ismail
*Assistant Examiner* — Zoheb S Imtiaz
(74) *Attorney, Agent, or Firm* — Quinn IP Law

(57) ABSTRACT

A method for operating an electromagnetic actuator includes an actuation event utilizing a current waveform for the actuator characterized by an initial peak pull-in current in a first direction of current flow when the actuator is commanded to an actuated position; and a reversed peak current in a second opposite direction of current flow applied after the actuator is commanded to a rest position. The reversed
(Continued)

peak current has a magnitude that is greater than the magnitude of the initial peak pull-in current.

17 Claims, 9 Drawing Sheets

(51) Int. Cl.
- F02D 41/20 (2006.01)
- H03K 17/64 (2006.01)
- F02M 57/00 (2006.01)
- F02D 41/40 (2006.01)
- H01F 7/16 (2006.01)
- H01F 7/18 (2006.01)

(52) U.S. Cl.
CPC ...... *F02M 51/0671* (2013.01); *F02M 57/005* (2013.01); *F16K 31/0675* (2013.01); *H01F 7/1607* (2013.01); *H01F 7/18* (2013.01); *H03K 17/64* (2013.01); *F02D 2041/2034* (2013.01); *F02D 2041/2044* (2013.01); *F02D 2041/2055* (2013.01); *F02D 2041/2058* (2013.01); *F02M 2200/24* (2013.01); *F02M 2200/247* (2013.01)

(58) Field of Classification Search
CPC ............. F02M 57/005; F02M 2200/24; F02M 2200/247; F16K 31/0675; H01F 7/18; H02P 25/06; H03K 17/64
See application file for complete search history.

(56) References Cited

U.S. PATENT DOCUMENTS

| | | | |
|---|---|---|---|
| 6,168,135 | B1 | 1/2001 | Fochtrnan |
| 6,321,700 | B1 | 11/2001 | Hein |
| 2002/0148442 | A1 | 10/2002 | Fraenkle |
| 2003/0127532 | A1* | 7/2003 | Coldren ................ F02M 47/02 239/5 |
| 2003/0184946 | A1 | 10/2003 | Kolmanovsky |
| 2006/0238949 | A1* | 10/2006 | Cheever, Jr. ............ F02D 41/20 361/139 |
| 2007/0056784 | A1 | 3/2007 | Joe |
| 2007/0120332 | A1 | 5/2007 | Bushko |
| 2007/0285195 | A1 | 12/2007 | Nehl |
| 2008/0204178 | A1 | 8/2008 | Maranville |
| 2010/0018503 | A1 | 1/2010 | Perry |
| 2011/0125391 | A1 | 5/2011 | McAlister |
| 2012/0018262 | A1 | 1/2012 | Winkler |
| 2012/0101707 | A1 | 4/2012 | Kemmer |
| 2012/0239278 | A1 | 9/2012 | Becker |
| 2012/0247428 | A1 | 10/2012 | Grimrninger |
| 2013/0113407 | A1 | 5/2013 | Neelakantan |
| 2013/0133748 | A1 | 5/2013 | Lehner |
| 2014/0069533 | A1 | 3/2014 | Gorzen |
| 2014/0092516 | A1 | 4/2014 | Koch |
| 2014/0110508 | A1 | 4/2014 | Dames |
| 2015/0123662 | A1 | 5/2015 | Yasui |
| 2015/0267660 | A1 | 9/2015 | Nehl |
| 2015/0267661 | A1 | 9/2015 | Namuduri |
| 2015/0267662 | A1 | 9/2015 | Nehl |
| 2015/0267663 | A1 | 9/2015 | Namuduri |
| 2015/0267666 | A1 | 9/2015 | Gopalakrishnan |
| 2015/0267667 | A1 | 9/2015 | Narnuduri |
| 2015/0267668 | A1 | 9/2015 | Gopalakrishnan |
| 2015/0267669 | A1 | 9/2015 | Nehl |
| 2015/0267670 | A1 | 9/2015 | Nehl |
| 2015/0285175 | A1 | 10/2015 | Parrish |

FOREIGN PATENT DOCUMENTS

| | | |
|---|---|---|
| DE | 199 21 938 A1 | 12/1999 |
| DE | 10 2007 053 877 B3 | 4/2009 |
| DE | 10 2011 083 007 A1 | 3/2013 |
| DE | 10 2012 208 781 B4 | 11/2013 |
| EP | 0 074 420 A1 | 3/1983 |
| EP | 1670005 A2 | 6/2006 |
| EP | 2336544 A1 | 6/2011 |
| JP | 10-311265 A | 11/1998 |
| JP | 2007-270658 A | 10/2007 |
| KR | 10-2002-0094494 A | 12/2002 |
| WO | WO 90-02872 A1 | 3/1990 |
| WO | WO 87-01765 A1 | 3/1997 |
| WO | WO 2015 143109 A1 | 9/2015 |
| WO | WO 2015 143116 A1 | 9/2015 |

OTHER PUBLICATIONS

T. W. Nehl, ANTIC85: A General Purpose Finite Element Package for Computer Aided Design, IEEE Transactions on Magnetics, Jan. 1988, 358-361, vol. 24, No. 1.

\* cited by examiner

OPTIMUM CURRENT DRIVE FOR A ACTUATOR CONTROL

TECHNICAL FIELD

This disclosure is related to solenoid-activated actuators.

BACKGROUND

Solenoid actuators can be used to control fluids (liquids and gases), or for positioning or for control functions. A typical example of a solenoid actuator is the fuel injector. Fuel injectors are used to inject pressurized fuel into a manifold, an intake port, or directly into a combustion chamber of internal combustion engines. Known fuel injectors include electromagnetically-activated solenoid devices that overcome mechanical springs to open a valve located at a tip of the injector to permit fuel flow therethrough. Injector driver circuits control flow of electric current to the electromagnetically-activated solenoid devices to open and close the injectors. Injector driver circuits may operate in a peak-and-hold control configuration or a saturated switch configuration.

Fuel injectors are calibrated, with a calibration including an injector activation signal including an injector open-time, or injection duration, and a corresponding metered or delivered injected fuel mass operating at a predetermined or known fuel pressure. Injector operation may be characterized in terms of injected fuel mass per fuel injection event in relation to injection duration. Injector characterization includes metered fuel flow over a range between high flow rate associated with high-speed, high-load engine operation and low flow rate associated with engine idle conditions.

It is known for engine control to benefit from injecting a plurality of small injected fuel masses in rapid succession. Generally, when a dwell time between consecutive injection events is less than a dwell time threshold, injected fuel masses of subsequent fuel injection events often result in a larger delivered magnitude than what is desired even through equal injection durations are utilized. Accordingly, such subsequent fuel injection events can become unstable resulting in unacceptable repeatability. This undesirable occurrence is attributed to the existence of residual magnetic flux within the fuel injector that is produced by the preceding fuel injection event that offers some assistance to the immediately subsequent fuel injection event. The residual magnetic flux is produced in response to persistent eddy currents and magnetic hysteresis within the fuel injector as a result of shifting injected fuel mass rates that require different initial magnetic flux values.

SUMMARY

A method for operating an electromagnetic actuator includes an actuation event utilizing a current waveform for the actuator characterized by an initial peak pull-in current in a first direction of current flow when the actuator is commanded to an actuated position; and a reversed peak current in a second opposite direction of current flow applied after the actuator is commanded to a rest position. The reversed peak current has a magnitude that is greater than the magnitude of the initial peak pull-in current.

BRIEF DESCRIPTION OF THE DRAWINGS

One or more embodiments will now be described, by way of example, with reference to the accompanying drawings, in which:

FIG. 1-2 illustrates a schematic sectional view of the activation controller of FIG. 1-1, in accordance of the present disclosure;

FIG. 1-3 illustrates a schematic sectional view of an injector driver of FIGS. 1-1 and 1-2, in accordance to the present disclosure;

FIG. 2 illustrates a non-limiting exemplary first plot 1000 of measured current and fuel flow rate and a non-limiting exemplary second plot 1010 of measured main excitation coil and search coil voltages for two successive fuel injection events having identical current pulses that are separated by a dwell time that is not indicative of being closely spaced, in accordance with the present disclosure;

FIG. 3 illustrates a non-limiting exemplary first plot 1020 of measured current and fuel flow rate and a non-limiting exemplary second plot 1030 of measured main excitation coil and search coil voltages for two successive fuel injection events having identical current pulses that are separated by a dwell time that is indicative of being closely spaced, in accordance with the present disclosure;

FIG. 10 illustrates a non-limiting exemplary plot 1100 of simulated current and injector commands for two successive fuel injection events having optimum current waveforms alternating in polarity, in accordance with the

DETAILED DESCRIPTION

This disclosure describes the concepts of the presently claimed subject matter with respect to an exemplary application to linear motion fuel injectors. However, the claimed subject matter is more broadly applicable to any linear or non-linear electromagnetic actuator that employs an electrical coil for inducing a magnetic field within a magnetic core resulting in an attractive force acting upon a movable armature. Typical examples include fluid control solenoids, gasoline or diesel or CNG fuel injectors employed on internal combustion engines and non-fluid solenoid actuators for positioning and control.

Figure 1:
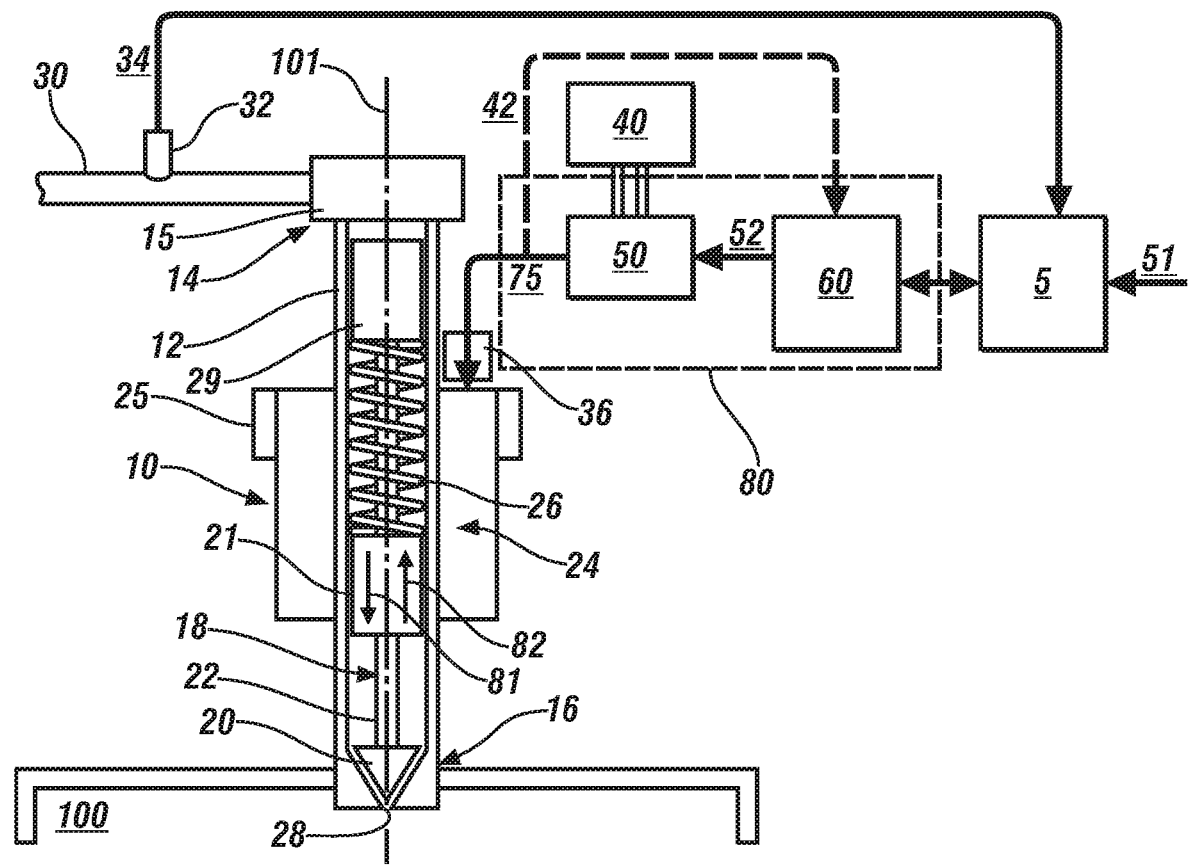
FIG. 1-1 illustrates a schematic sectional view of a fuel injector and an activation controller, in accordance with the present disclosure.

Referring now to the drawings, wherein the showings are for the purpose of illustrating certain exemplary embodiments only and not for the purpose of limiting the same, FIG. 1-1 schematically illustrates a non-limiting exemplary embodiment of an electromagnetically-activated direct-injection fuel injector 10. While an electromagnetically-activated direct-injection fuel injector is depicted in the illustrated embodiment, a port-injection fuel injector is equally applicable. The fuel injector 10 is configured to inject fuel directly into a combustion chamber 100 of an internal combustion engine. An activation controller 80 electrically operatively connects to the fuel injector 10 to control activation thereof. The activation controller 80 corresponds to only the fuel injector 10. In the illustrated embodiment, the activation controller 80 includes a control module 60 and an injector driver 50. The control module 60 electrically operatively connects to the injector driver 50 that electrically operatively connects to the fuel injector 10 to control activation thereof. The fuel injector 10, control module 60 and injector driver 50 may be any suitable devices that are configured to operate as described herein. In the illustrated embodiment, the control module 60 includes a processing device. In one embodiment, one or more components of the activation controller 80 are integrated within a connection assembly 36 of the fuel injector 36. In another embodiment, one or more components of the activation controller 80 are integrated within a body 12 of the fuel injector 10. In even yet another embodiment, one or more components of the activation controller 80 are external to—and in close proximity with—the fuel injector 10 and electrically operatively connected to the connection assembly 36 via one or more cables and/or wires. The terms "cable" and "wire" will be used interchangeably herein to provide transmission of electrical power and/or transmission of electrical signals.

Control module, module, control, controller, control unit, processor and similar terms mean any one or various combinations of one or more of Application Specific Integrated Circuit(s) (ASIC), electronic circuit(s), central processing unit(s) (preferably microprocessor(s)) and associated memory and storage (read only, programmable read only, random access, hard drive, etc.) executing one or more software or firmware programs or routines, combinational logic circuit(s), input/output circuit(s) and devices, appropriate signal conditioning and buffer circuitry, and other components to provide the described functionality. Software, firmware, programs, instructions, routines, code, algorithms and similar terms mean any instruction sets including calibrations and look-up tables. The control module has a set of control routines executed to provide the desired functions. Routines are executed, such as by a central processing unit, and are operable to monitor inputs from sensing devices and other networked control modules, and execute control and diagnostic routines to control operation of actuators. Routines may be executed at regular intervals, for example each 3.125, 6.25, 12.5, 25 and 100 milliseconds during ongoing engine and vehicle operation. Alternatively, routines may be executed in response to occurrence of an event.

In general, an armature is controllable to one of an actuated position and a static or rest position. The fuel injector 10 may be any suitable discrete fuel injection device that is controllable to one of an open (actuated) position and a closed (static or rest) position. In one embodiment, the fuel injector 10 includes a cylindrically-shaped hollow body 12 defining a longitudinal axis 101. A fuel inlet 15 is located at a first end 14 of the body 12 and a fuel nozzle 28 (the fuel nozzle maybe a single opening or multiple holes in the case of a ball shaped valve) is located at a second end 16 of the body 12. The fuel inlet 15 is fluidly coupled to a high-pressure fuel line 30 that fluidly couples to a high-pressure injection pump. A valve assembly 18 is contained in the body 12, and includes a needle valve 20, a spring-activated pintle 22 and an armature portion 21. The needle valve 20 interferingly seats in the fuel nozzle 28 to control fuel flow therethrough. While the illustrated embodiment depicts a triangularly-shaped needle valve 20, other embodiments may utilize a ball. In one embodiment, the armature portion 21 is fixedly coupled to the pintle 22 and configured to linear translate as a unit with the pintle 22 and the needle valve 20 in first and second directions 81, 82, respectively. In another embodiment, the armature portion 21 may be slidably coupled to the pintle 22. For instance, the armature portion 21 may slide in the first direction 81 until being stopped by a pintle stop fixedly attached to the pintle 22. Likewise, the armature portion 21 may slide in the second direction 82 independent of the pintle 22 until contacting a pintle stop fixedly attached to the pintle 22. Upon contact with the pintle stop fixedly attached to the pintle 22, the force of the armature portion 21 causes the pintle 22 to be urged in the second direction 82 with the armature portion 21. The armature portion 21 may include protuberances to engage with various stops within the fuel injector 10.

An annular electromagnet assembly 24, including an electrical coil and magnetic core, is configured to magnetically engage the armature portion 21 of the valve assembly. The electrical coil and magnetic core assembly 24 is depicted for illustration purposes to be outside of the body of the fuel injector; however, embodiments herein are directed toward the electrical coil and magnetic core assembly 24 to be either integral to, or integrated within, the fuel injector 10. The electrical coil is wound onto the magnetic core, and includes terminals for receiving electrical current from the injector driver 50. Hereinafter, the "electrical coil and magnetic core assembly" will simply be referred to as an "electrical coil 24". When the electrical coil 24 is deactivated and de-energized, the spring 26 urges the valve assembly 18 including the needle valve 20 toward the fuel nozzle 28 in the first direction 81 to close the needle valve 20 and prevent fuel flow therethrough. When the electrical coil 24 is activated and energized, electromagnetic force (herein after "magnetic force") acts on the armature portion 21 to overcome the spring force exerted by the spring 26 and urges the valve assembly 18 in the second direction 82, moving the needle valve 20 away from the fuel nozzle 28 and permitting flow of pressurized fuel within the valve assembly 18 to flow through the fuel nozzle 28. The fuel injector 10 may include a stopper 29 that interacts with the valve assembly 18 to stop translation of the valve assembly 18 when it is urged to open. In one embodiment, a pressure sensor 32 is configured to obtain fuel pressure 34 in the high-pressure fuel line 30 proximal to the fuel injector 10, preferably upstream of the fuel injector 10. In another embodiment, a pressure sensor may be integrated within the inlet 15 of the fuel injector in lieu of the pressure sensor 32 in the fuel rail 30 or in combination with the pressure sensor. The fuel injector 10 in the illustrated embodiment of FIG. 1-1 is not limited to the spatial and geometric arrangement of the features described herein, and may include additional features and/or other spatial and geometric arrangements known in the art for operating the fuel injector 10 between open and closed positions for controlling the delivery of fuel to the engine 100.

The control module 60 generates an injector command signal 52 that controls the injector driver 50, which activates the fuel injector 10 to the open position for affecting a fuel injection event. In the illustrated embodiment, the control module 60 communicates with one or more external control modules such as an engine control module (ECM) 5; however, the control module 60 may be integral to the ECM in other embodiments. The injector command signal 52 correlates to a desired mass of fuel to be delivered by the fuel injector 10 during the fuel injection event. Similarly, the injector command signal 52 may correlate to a desired fuel flow rate to be delivered by the fuel injector 10 during the fuel injection event. As used herein, the term "desired injected fuel mass" refers to the desired mass of fuel to be delivered to the engine by the fuel injector 10. As used herein, the term "desired fuel flow rate" refers to the rate at which fuel is to be delivered to the engine by the fuel injector 10 for achieving the desired mass of fuel. The desired injected fuel mass can be based upon one or more monitored input parameters 51 input to the control module 60 or ECM 5. The one or more monitored input parameters 51 may include, but are not limited to, an operator torque request, manifold absolute pressure (MAP), engine speed, engine temperature, fuel temperature, and ambient temperature obtained by known methods. The injector driver 50 generates an injector activation signal 75 in response to the injector command signal 52 to activate the fuel injector 10. The injector activation signal 75 controls current flow to the electrical coil 24 to generate electromagnetic force in response to the injector command signal 52. An electric power source 40 provides a source of DC electric power for the injector driver 50. In some embodiments, the DC electric power source provides low voltage, e.g., 12 V, and a boost converter may be utilized to output a high voltage, e.g., 24V to 200 V, that is supplied to the injector driver 50. When activated using the injector activation signal 75, the electromagnetic force generated by the electrical coil 24 urges the armature portion 21 in the second direction 82. When the armature portion 21 is urged in the second direction 82, the valve assembly 18 in consequently caused to urge or translate in the second direction 81 to an open position, allowing pressurized fuel to flow therethrough. The injector driver 50 controls the injector activation signal 75 to the electrical coil 24 by any suitable method, including, e.g., pulsewidth-modulate (PWM) electric power flow. The injector driver 50 is configured to control activation of the fuel injector 10 by generating suitable injector activation signals 75. In embodiments that employ a plurality of successive fuel injection events for a given engine cycle, an injector activation signal 75, that is fixed for each of the fuel injection events within the engine cycle, may be generated.

The injector activation signal 75 is characterized by an injection duration and a current waveform that includes an initial peak pull-in current and a secondary hold current. The initial peak pull-in current is characterized by a steady-state ramp up to achieve a peak current, which may be selected as described herein. The initial peak pull-in current generates electromagnetic force that acts on the armature portion 21 of the valve assembly 18 to overcome the spring force and urge the valve assembly 18 in the second direction 82 to the open position, initiating flow of pressurized fuel through the fuel nozzle 28. When the initial peak pull-in current is achieved, the injector driver 50 reduces the current in the electrical coil 24 to the secondary hold current. The secondary hold current is characterized by a somewhat steady-state current that is less than the initial peak pull-in current. The secondary hold current is a current level controlled by the injector driver 50 to maintain the valve assembly 18 in the open position to continue the flow of pressurized fuel through the fuel nozzle 28. The secondary hold current is preferably indicated by a minimum current level. When very small fuel quantities are required, the activation current waveform will not reach its peak and the current hold phase will be omitted in that case. The injector driver 50 is configured as a bi-directional current driver capable of providing a negative current flow for drawing current from the electrical coil 24. As used herein, the term "negative current flow" refers to the direction of the current flow for energizing the electrical coil to be reversed. Accordingly, the terms "negative current flow" and "reverse current flow" are used interchangeably herein.

Embodiments herein are directed toward controlling the fuel injector for a plurality of fuel injection events that are closely-spaced during an engine cycle. As used herein, the term "closely-spaced" refers to a dwell time between each consecutive fuel injection event being less than a predetermined dwell time threshold. As used herein, the term "dwell time" refers to a period of time between an end of injection for the first fuel injection event (actuator event) and a start of injection for a corresponding second fuel injection event (actuator event) of each consecutive pair of fuel injection events. The dwell time threshold can be selected to define a period of time such that dwell times less than the dwell time threshold are indicative of producing instability and/or deviations in the magnitude of injected fuel mass delivered for each of the fuel injection events. The instability and/or deviations in the magnitude of injected fuel mass may be responsive to a presence of secondary magnetic effects. The secondary magnetic effects include persistent eddy currents and magnetic hysteresis within the fuel injector and a residual flux based thereon. The persistent eddy currents and magnetic hysteresis are present due to transitions in initial flux values between the closely-spaced fuel injection events. Accordingly, the dwell time threshold is not defined by any fixed value, and selection thereof may be based upon, but not limited to, fuel temperature, fuel injector temperature, fuel injector type, fuel pressure and fuel properties such as fuel types and fuel blends. As used herein, the term "flux" refers to magnetic flux indicating the total magnetic field generated by the electrical coil 24 and passing through the armature portion. Since the turns of the electrical coil 24 link the magnetic flux in the magnetic core, this flux can therefore be equated from the flux linkage. The flux linkage is based upon the flux density passing through the armature portion, the surface area of the armature portion adjacent to the air gap and the number of turns of the coil 24. Accordingly, the terms "flux", "magnetic flux" and "flux linkage" will be used interchangeably herein unless otherwise stated.

For fuel injection events that are not closely spaced, a fixed current waveform independent of dwell time may be utilized for each fuel injection event because the first fuel injection event of a consecutive pair has little influence on the delivered injected fuel mass of the second fuel injection event of the consecutive pair. However, the first fuel injection event may be prone to influence the delivered injected fuel mass of the second fuel injection event, and/or further subsequent fuel injection events, when the first and second fuel injection events are closely-spaced and a fixed current wave form is utilized. Any time a fuel injection event is influenced by one or more preceding fuel injection events of an engine cycle, the respective delivered injected fuel mass of the corresponding fuel injection event can result in an unacceptable repeatability over the course of a plurality of engine cycles and the consecutive fuel injection events are considered closely-spaced. More generally, any consecutive actuator events wherein residual flux from the preceding actuator event affects performance of the subsequent actuator event relative to a standard, for example relative to performance in the absence of residual flux, are considered closely-spaced.

Figures 1, 2:
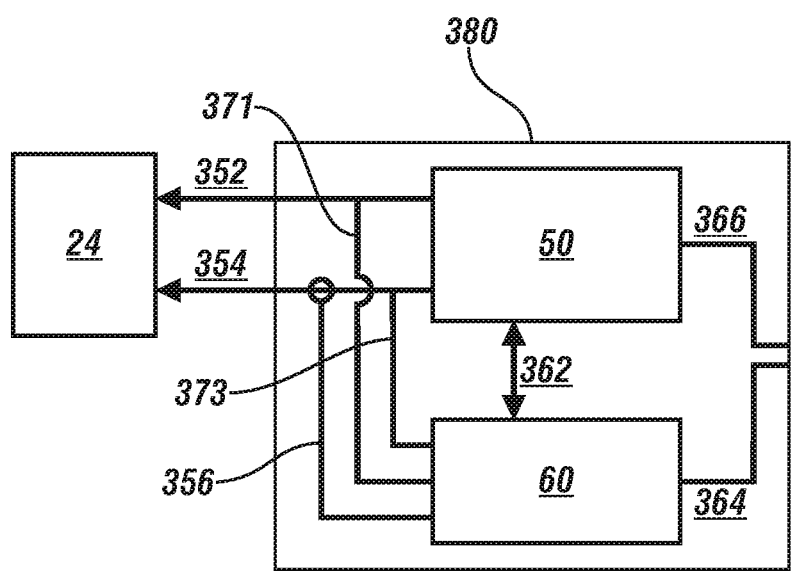

FIG. 2 illustrates a non-limiting exemplary first plot 1000 of measured current and fuel flow rate and a non-limiting exemplary second plot 1010 of measured main excitation coil and search coil voltages for two successive fuel injection events having identical current pulses that are separated by a dwell time that is not indicative of being closely spaced, in accordance with the present disclosure. Dashed vertical line 1001 extending through each of plots 1000 and 1010 represents a first time whereat an end of injection for the first fuel injection event occurs and dashed vertical line 1002 represents a second time whereat a start of injection for the second fuel injection event occurs. The dwell time 1003 represents a period of time between dashed vertical lines 1001 and 1002 separating the first and second fuel injection events. In the illustrated embodiment, the dwell time exceeds a dwell time threshold. Thus, the first and second fuel injection events are not indicative of being closely-spaced.

Referring to the first plot 1000, measured current and flow rate profiles 1011, 1012, respectively, are illustrated for the two fuel injection events. The vertical y-axis along the left side of plot 1000 denotes electrical current in Amperage (A) and the vertical y-axis along the right side of plot 1000 denotes fuel flow rate in milligrams (mg) per milliseconds (ms). The measured current profile 1011 is substantially identical for each of the fuel injection events. Likewise, the measured fuel flow rate profile 1012 is substantially identical for each of the fuel injection events due to the fuel injection events not indicative of being closely-spaced.

Referring to the second plot 1010, measured main excitation coil and search coil voltage profiles 1013, 1014, respectively, are illustrated for the two fuel injection events. The measured main coil voltage may represent a measured voltage of the electromagnetic coil 24 of FIG. 1-1 and the measured search coil voltage may represent a measured voltage of a search coil mutually magnetically coupled to the electromagnetic coil 24 of FIG. 1-1. The vertical y-axis of plot 1010 denotes voltage (V). Accordingly, when the main excitation coil is energized, magnetic flux generated by the main excitation coil may be linked to the search coil due to the mutual magnetic coupling. The measured search coil voltage profile 1014 indicates the voltage induced in the search coil which is proportional to the rate of change of the mutual flux-linkage. The measured main excitation coil and search coil voltage profiles 1013, 1014, respectively, of plot 1010 are substantially identical for each of the first and second fuel injection events that are not indicative of being closely-spaced.

Figures 1, 2, 3:
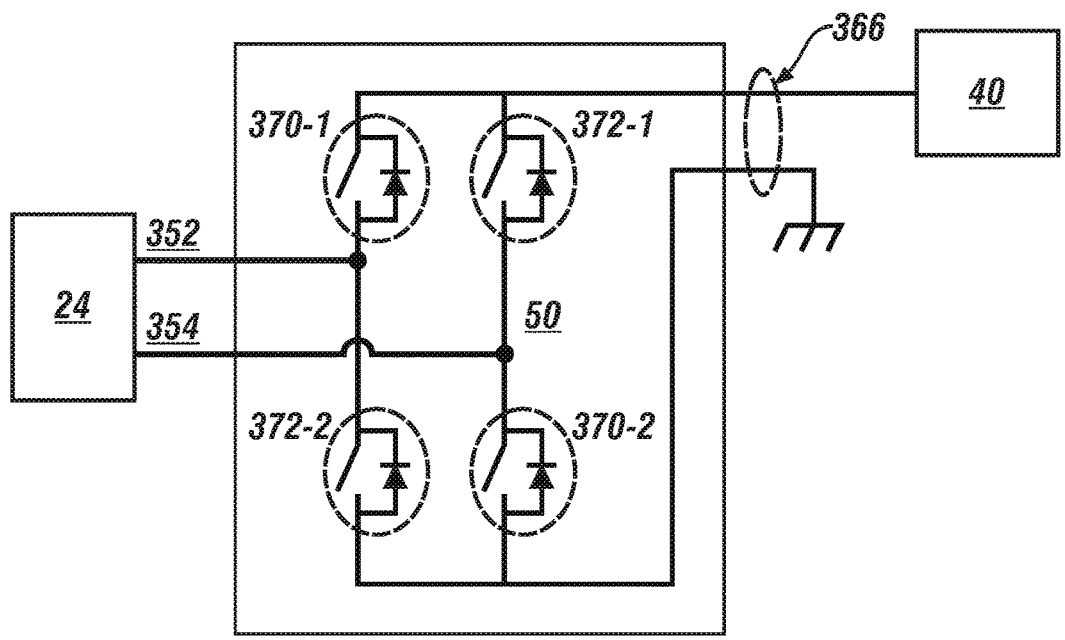
Figure 2:
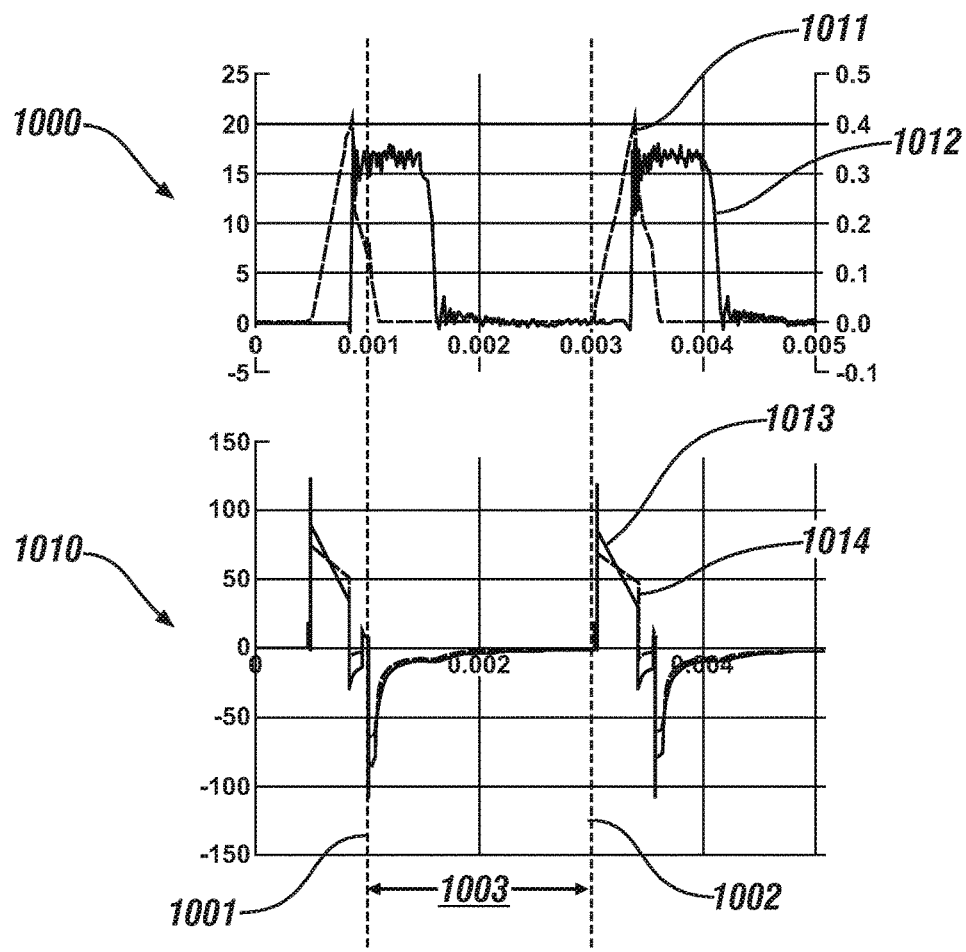
Figure 3:
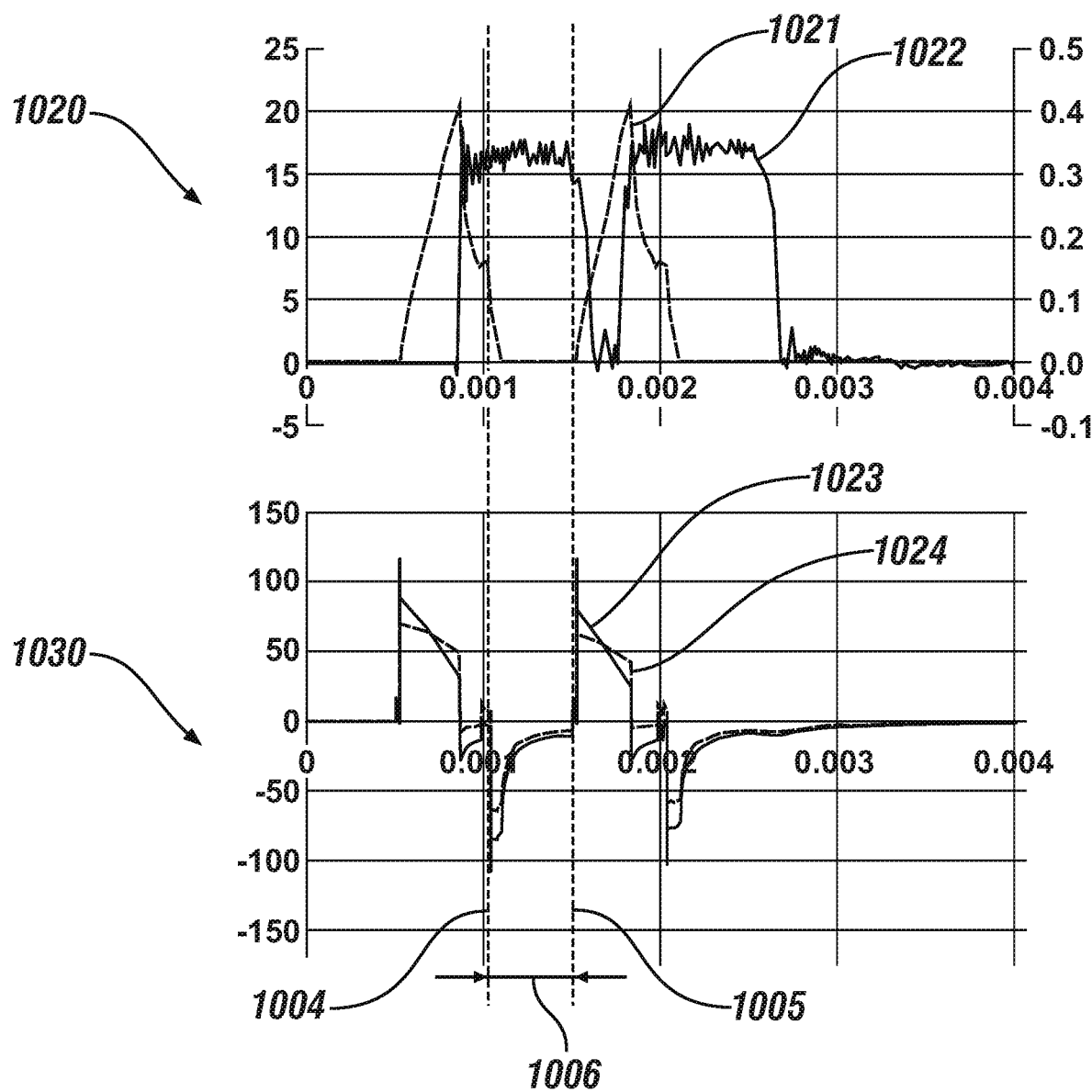

FIG. 3 illustrates a non-limiting exemplary first plot 1020 of measured current and fuel flow rate and a non-limiting exemplary second plot 1030 of measured main excitation coil and search coil voltages for two successive fuel injection events having identical current pulses that are separated by a dwell time that is indicative of being closely spaced, in accordance with the present disclosure. The horizontal x-axis in each of plots 1020 and 1030 denotes time in seconds (s). Dashed vertical line 1004 extending through each of plots 1020 and 1030 represents a first time whereat an end of injection for the first fuel injection event occurs and dashed vertical line 1005 represents a second time whereat a start of injection for the second fuel injection event occurs. The dwell time 1006 represents a period of time between dashed vertical lines 1004 and 1005 separating the first and second fuel injection events. In the illustrated embodiment, the dwell time is less than a dwell time threshold. Thus, the first and second fuel injection events are indicative of being closely-spaced.

Referring to the first plot 1020, measured current and flow rate profiles 1021, 1022, respectively, are illustrated for the two fuel injection events. The vertical y-axis along the left side of plot 1020 denotes electrical current in Amperage (A) and the vertical y-axis along the right side of plot 1020 denotes fuel flow rate in milligrams (mg) per millisecond (ms). The measured current profile 1021 is substantially identical for each of the fuel injection events. However, the measured flow rate profile 1022 illustrates a variation in the measured fuel flow rate between each of the first and second fuel injection events even though the measured current profiles are substantially identical. This variance in the measured fuel flow rate is inherent in closely-spaced fuel injection events and undesirably results in an injected fuel mass delivered at the second fuel injection event that is different than an injected fuel mass delivered at the first fuel injection event.

Referring to the second plot 1030, measured main excitation coil and search coil voltage profiles 1023, 1024, respectively, are illustrated for the two fuel injection events. The measured main coil voltage may represent a measured voltage of the electrical coil 24 of FIG. 1-1 and the measured search coil voltage may represent a measured voltage of a search coil mutually magnetically coupled to the electrical coil 24 of FIG. 1-1. The vertical y-axis of plot 1030 denotes voltage (V). Accordingly, when the main excitation coil is energized, magnetic flux generated by the main excitation coil may be linked to the search coil due to the mutual magnetic coupling. The measured search coil voltage profile 1024 indicates the voltage induced in the search coil which is proportional to the rate of change of the mutual flux-linkage. The measured main excitation coil and search coil voltage profiles 1023, 1024, respectively, of plot 1030 fluctuate during the second injection event in comparison to the first fuel injection event. This fluctuation is indicative of the presence of residual flux or magnetic flux when the injection events are closely-spaced. Referring to plot 1010 of FIG. 2 the measured main excitation coil and search coil voltage profiles 1013, 1014, respectively do not fluctuate during the second injection event in comparison to the first fuel injection event when the first and second fuel injection events are not closely-spaced.

Referring back to FIG. 1-1, exemplary embodiments are further directed toward providing feedback signal(s) 42 from the fuel injector 10 back to the control module 60 and/or the injector driver 50. Discussed in greater detail below, sensor devices may be integrated within the fuel injector 10 for measuring various fuel injector parameters for obtaining the flux linkage of the electrical coil 24, voltage of the electrical coil 24 and current through the electrical coil 24. A current sensor may be provided on a current flow path between the activation controller 80 and the fuel injector to measure the current provided to the electrical coil or the current sensor can be integrated within the fuel injector 10 on the current flow path. The fuel injector parameters provided via feedback signal(s) 42 may include the flux linkage, voltage and current directly measured by corresponding sensor devices integrated within the fuel injector 10. Additionally or alternatively, the fuel injector parameters may include proxies provided via feedback signal(s) 42 to—and used by—the control module 60 to estimate the flux linkage, magnetic flux, the voltage, and the current within the fuel injector 10. Having feedback of the flux linkage of the electrical coil 24, the voltage of the electrical coil 24 and current provided to the electrical coil 24, the control module 60 may advantageously modify the activation signal 75 to the fuel injector 10 for multiple consecutive injection events. It will be understood that conventional fuel injectors are controlled by open loop operation based solely upon a desired current waveform obtained from look-up tables without any information related to the force producing component of the flux linkage (e.g., magnetic flux) affecting movement of the armature portion 21. As a result, conventional feed-forward fuel injectors that only account for current flow for controlling the fuel injector 10, are prone to instability in consecutive fuel injection events that are closely-spaced.

It is known when the injector driver 50 only provides current uni-directionally in a positive first direction to energize the electrical coil 24, releasing the current to remain stable at zero will result in the magnetic flux within the fuel injector to gradually decay, e.g., taper off, towards zero. However, the response time for the magnetic flux to decay is slow, and the presence of magnetic hysteresis within the fuel injector often results in the presence of residual flux when a subsequent closely-spaced fuel injection event is initiated. As aforementioned, the presence of the residual flux impacts the accuracy of the fuel flow rate and injected fuel mass to be delivered in a subsequent closely-spaced fuel injection event.

FIG. 1-2 illustrates the activation controller 80 of FIG. 1-1, in accordance with the present disclosure. Signal flow path 362 provides communication between the control module 60 and the injector driver 50. For instance, signal flow path 362 provides the injector command signal (e.g., command signal 52 of FIG. 1-1) that controls the injector driver 50. The control module 60 further communicates with the external ECM 5 via signal flow path 364 within the activation controller 380 that is in electrical communication with a power transmission cable. For instance, signal flow path 364 may provide monitored input parameters (e.g., monitored input parameters 51 of FIG. 1-1) from the ECM 5 to the control module 60 for generating the injector command signal 52. In some embodiments, the signal flow path 364 may provide feedback fuel injector parameters (e.g., feedback signal(s) 42 of FIG. 1-1) to the ECM 5.

The injector driver 50 receives DC electric power from the power source 40 of FIG. 1 via a power supply flow path 366. The signal flow path 364 can be eliminated by use of a small modulation signal added to the power supply flow path 366. Using the received DC electric power, the injector driver 50 may generate injector activation signals (e.g., injector activation signals 75 of FIG. 1-1) based on the injector command signal from the control module 60.

The injector driver 50 is configured to control activation of the fuel injector 10 by generating suitable injector activation signals 75. The injector driver 350 is a bi-directional current driver providing positive current flow via a first current flow path 352 and negative current flow via a second current flow path 354 to the electrical coil 24 in response to respective injector activation signals 75. The positive current via the first current flow path 352 is provided to energize the electrical coil 24 and the negative current via the second current flow path 354 reverses current flow through the electrical coil 24. Current flow paths 352 and 354 form a closed loop; that is, a positive current into 352 results in an equal and opposite (negative) current in flow path 354, and vice versa. The direction of the current flow along the first and a second current flow paths 352, 354, respectively, can be alternated to reset residual flux within the fuel injector and control bounce of the armature portion 21. Signal flow path 371 can provide a voltage of the first current flow path 352 to the control module 60 and signal flow path 373 can provide a voltage of the second current flow path 354 to the control module 60. The voltage and current applied to the electrical coil 24 is based on a difference between the voltages at the signal flow paths 371 and 373. In one embodiment, the injector driver 50 utilizes open loop operation to control activation of the fuel injector 10, wherein the injector activation signals are characterized by precise predetermined current waveforms. In another embodiment, the injector driver 50 utilizes closed loop operation to control activation of the fuel injector 10, wherein the injector activation signals are based upon fuel injector parameters provided as feedback to the control module, via the signal flow paths 371 and 373. A measured current flow to the coil 24 can be provided to the control module 60, via signal flow path 356. In the illustrated embodiment, the current flow is measured by a current sensor on the second current flow path 354. The fuel injector parameters may include flux linkage, voltage and current values within the fuel injector 10 or the fuel injector parameters may include proxies used by the control module 60 to estimate flux linkage, voltage and current within the fuel injector 10.

In some embodiments, the injector driver 50 is configured for full four quadrant operation. FIG. 1-3 illustrates an exemplary embodiment of the injector driver 50 of FIGS. 1-2 utilizing two switch sets 370 and 372 to control the current flow provided between the injector driver 50 and the electrical coil 24. In the illustrated embodiment, the first switch set 370 includes switch devices 370-1 and 370-2 and the second switch set 372 includes switch devices 372-1 and 372-2. The switch devices 370-1, 370-2, 372-1, 372-2 can be solid state switches and may include Silicon (Si) or wide band gap (WBG) semiconductor switches enabling high speed switching at high temperatures. The four quadrant operation of the injector driver 50 controls the direction of current flow into and out of the electrical coil 24 based upon a corresponding switch state determined by the control module 60. The control module 60 may determine a positive switch state, a negative switch state and a zero switch state and command the first and second switch sets 370 and 372 between open and closed positions based on the determined switch state. In the positive switch state, the switch devices 370-1 and 370-2 of the first switch set 370 are commanded to the closed position and the switch devices 372-1 and 372-2 of the second switch set 372 are commanded to the open position to control positive current into the first current flow path 352 and out of the second current flow path 354. These switch devices may be further modulated using pulse width modulation to control the amplitude of the current. In the negative switch state, the switch devices 370-1 and 370-2 of the first switch set 370 are commanded to the open position and the switch devices 372-1 and 372-2 of the second switch set 372 are commanded to the closed position to control negative current into the second current flow path 354 and out of the first current flow path 352. These switch devices may be further modulated using pulse width modulation to control the amplitude of the current. In the zero switch state, all the switch devices 370-1, 370-2, 372-1, 372-2 are commanded to the open position to control no current into or out of the electromagnetic assembly. Thus, bi-directional control of current through the coil 24 may be effected.

Moreover, additional embodiments can include the switch sets 370 and 372 to be alternately switched between open and closed positions to alternate the direction of the current flow to the coil 24, including pulse width modulation control to effect current flow profiles. The utilization of two switch sets 370 and 372 allows for precise control of current flow direction and amplitude applied to the current flow paths 352 and 354 of the electrical coil 24 for multiple consecutive fuel injection events during an engine event by reducing the presence of eddy currents and magnetic hysteresis within the electrical coil 24.

Exemplary embodiments are directed toward providing an optimum current waveform for consecutive fuel injection events to rapidly reset residual magnetic flux within the fuel injector after each of the fuel injection events. In some embodiments, the optimum current waveform is only applied for consecutive fuel injection events separated by a dwell time indicative of being closely-spaced. The optimum current wave form for each consecutive fuel injection event is characterized by an initial peak pull-in current, a secondary hold current, and a negative peak current after the secondary hold current is released and the fuel injector is commanded to close. The initial peak pull-in and the secondary hold currents, respectively, include positive current flow in the first direction to energize the electrical coil 24 and the negative peak current includes negative current flow in the reversed second direction to the electrical coil 24 to reset the presence of residual flux after each fuel injection event. Resetting the residual flux after each fuel injection event is operative to avoid deviations between the corresponding delivered injected fuel masses of the consecutive fuel injection events as evidenced in the non-limiting exemplary first plot 1020 of FIG. 3. In some embodiments, the secondary hold current may not be utilized when the initial peak pull-in current is sufficient for delivering a desired small injected fuel mass.

A flux reset event reduces residual flux levels below that passively attained within the actuator at zero coil current and preferably to zero. Passive residual flux will refer to the level of residual flux within the actuator when the coil current is released to zero subsequent to an actuation event. The flux reset event includes a current flow profile exhibiting at least one duration of negative current flow or current direction reversal from the preceding actuation event which effects a magnetic flux through the actuator in opposition to the residual flux. In response to the negative current through the fuel injector the magnetic flux within the fuel injector is responsively reduced below the passive residual flux level and preferably approaches zero in the absence of some other non-zero level preference. In some instances, the magnetic flux may be reduced below zero (i.e. reversed) requiring the residual flux reset current flow profile to also reverse. Such positive and negative currents can effect a tapering of the magnetic flux toward a zero steady state flux. In an exemplary embodiment the fuel injection event uses a flux reset event initiated subsequent to release of the secondary hold current but only after the fuel injector closes to reduce residual flux below the passive residual flux level, in accordance with the present disclosure. Such a delay is desirable in applications wherein the time at which the static or rest position of the actuator (i.e. the injector closing time) is desirably known. The initiation of the flux reset event prior to injector closure may interfere with sensing of the closure and result in an indeterminate closing time.

Figure 4:
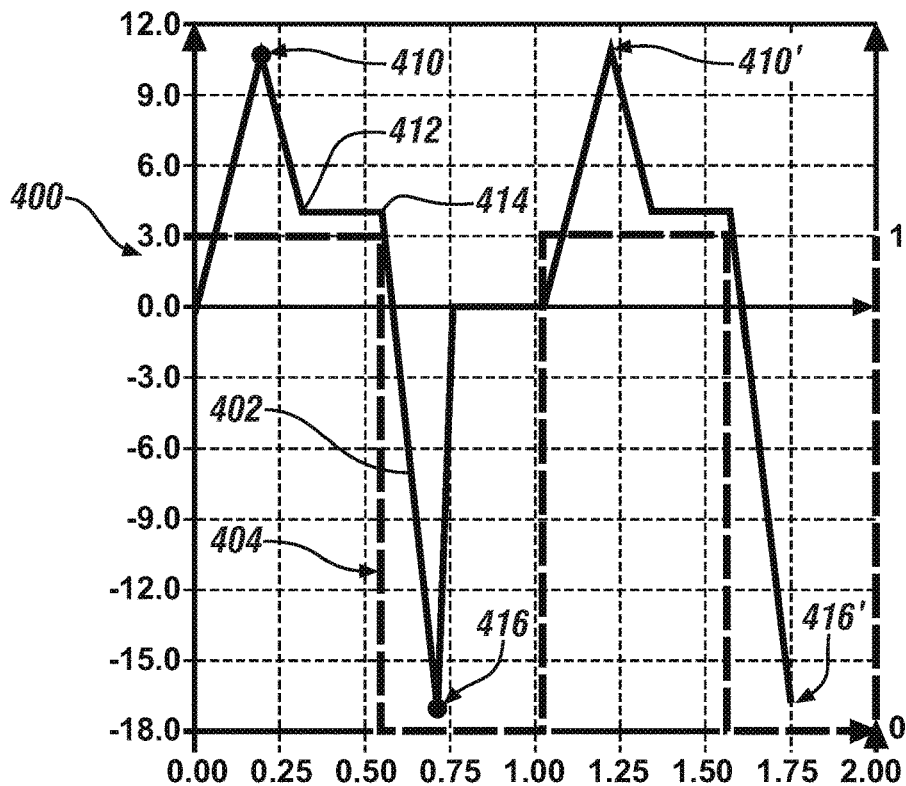
FIG. 4 illustrates a non-limiting exemplary plot 400 of simulated current and injector commands for two successive fuel injection events each having an optimum current waveform, in accordance with the present disclosure.

FIG. 4 illustrates a non-limiting exemplary plot 400 of simulated current and injector commands for two successive fuel injection events each having an optimum current waveform, in accordance with the present disclosure. In the illustrated embodiment, the fuel injection events are separated by a dwell time that is indicative of being closely spaced. Current profile line 402 represents the simulated current through the electrical coil 24 of FIG. 1-1 and injector command profile line 404 represents either an injector open command or an injector close command. The horizontal x-axis denotes time in milliseconds (ms). The left-side vertical y-axis denotes current in Amperage (A) and the right-side vertical y-axis denotes the injector command, whereat the fuel injector is commanded to close at "0" and commanded to open at "1". In response to the injector open command at 0 ms, the current profile line 402 increases from zero to a peak pull-in current at point 410 and is reduced to a secondary hold current between points 412 and 414. In response to the injector close command just after 0.50 ms, the secondary hold current is released to zero after point 414 and the electrical current flow through the electrical coil 24 is reversed in the negative direction until achieving a negative peak current at point 416. Upon achieving the negative peak current at point 416, the reversed negative current flow is released to zero at about 0.75 ms for a period of time until the injector is commanded to open just after 1.00 ms to initiate the second fuel injection. It will be recognized that the second fuel injection event includes a corresponding optimum current waveform that is substantially identical to that of the first fuel injection event, having a substantially identical magnitude of peak pull-in current (e.g., point 410') and a substantially identical magnitude of peak negative current (e.g., point 416'). For fuel injection events having small quantities/masses of fuel to be delivered, the secondary hold current may not be necessary.

In the illustrated non-limiting exemplary plot 400, a magnitude of the negative peak current (e.g., points 416, 416') for each of the successive fuel injection events is greater than a magnitude of the corresponding peak pull-in current (e.g., points 410, 410'). For instance, the peak pull-in current 410, 410' is at around 11.0 A and the negative peak current 416, 416' is at or around −17.0 A; however embodiments herein are not limited to any explicit magnitudes for the peak pull-in and negative peak currents. The magnitude of the negative peak current of the reversed negative current can be selected as a function of the commanded opening time of the fuel injector in one embodiment. In another embodiment, the magnitude of the negative peak current is a predetermined function of a desired injected fuel mass to be delivered when the injected fuel mass is less than a predetermined value (e.g., 5.0 milligrams). In even yet another embodiment, the magnitude of the negative peak current is selected to achieve a predetermined spacing or dwell time between fuel injection events that are closely spaced. In a non-limiting example, dwell times less than 500 microseconds can be indicative of closely-spaced fuel injection events. Moreover, once the fuel injector is commanded to close, some embodiments include the slope of the increasing reversed negative current flow (e.g., between points 414 and 416) to be selected as a predetermined function of the peak pull-in current from the instant the fuel injector was commanded to open. In another embodiment, the slope of the decreasing reversed negative current flow after the peak negative current (e.g., at point 416) is achieved can be selected as a predetermined function of the of the peak pull-in current from the instant the fuel injector was commanded to open. Additionally, the injector driver (e.g., injector driver 50 of FIGS. 1-1 thru 1-3) may include a drive voltage to the electrical coil that is a function of the time duration, e.g., dwell time, between each of the closely-spaced fuel injection events.

Figure 5:
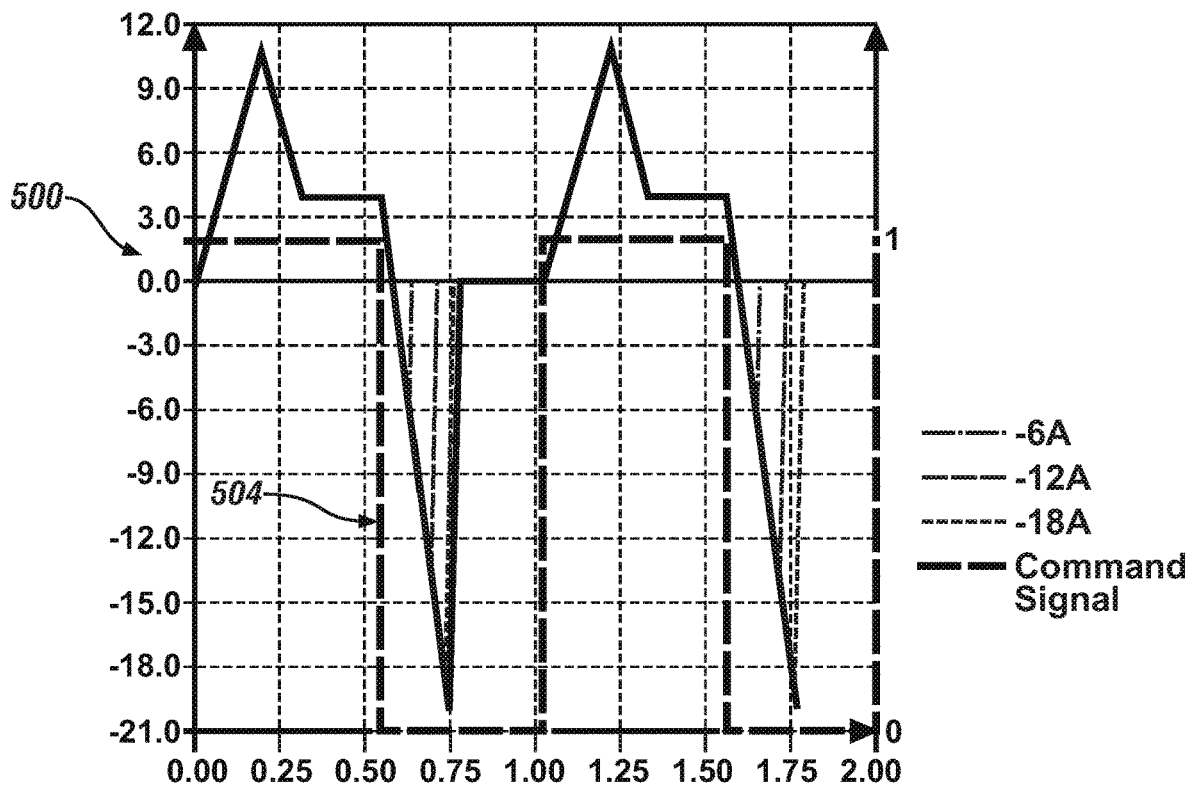
FIG. 5 illustrates a non-limiting exemplary plot 500 of simulated current and injector commands for a plurality of optimum current waveforms each having a different magnitude of a negative peak current for two successive fuel injection events, in accordance with the present disclosure.

FIG. 5 illustrates a non-limiting exemplary plot 500 of simulated current and injector commands for a plurality of optimum current waveforms each having a different magnitude of a negative peak current for two successive fuel injection events, in accordance with the present disclosure. In the illustrated embodiment, the fuel injection events are separated by a dwell time that is indicative of being closely spaced. A plurality of current profile lines, each characterized by a different magnitude of negative peak current, represent the simulated current through the electrical coil 24 of FIG. 1-1. Each of the current profiles lines correspond to respective ones of magnitudes of peak negative current for −6 A, −12 A, and −18 A. It will be appreciated that the values for the different magnitudes of peak negative current are exemplary and non-limiting, and can be based upon the injector type, the injector age, the peak pull-in current, the desired injected fuel mass to be delivered, the dwell time between successive fuel injection events, constraints on the driving voltage, and other factors. An injector command profile line 504 represents either an injector open command or an injector close command. The horizontal x-axis denotes time in milliseconds (ms). The left-side vertical y-axis denotes current in Amperage (A) and the right-side vertical y-axis denotes the injector command, whereat the fuel injector is commanded to close at "0" and commanded to open at "1". In response to the injector open command at 0 ms for the first fuel injection event, each of the current profile lines identically increase from zero to a peak pull-in current of about 11 A and are reduced to a secondary hold current until the injector close command just after 0.50 ms. Similarly, in response to the injector open command just after 1.00 ms for the second fuel injection event, each of the current profile lines identically increase from zero to a peak pull-in current of about 11 A and are reduced to a secondary hold current until the injector close command after 1.50 ms. For each of the first and second fuel injection events after the secondary hold current is released to zero, the electrical current flow through the electrical coil 24 is reversed in the negative direction at the same slope for each of the current profile lines until achieving the respective ones of the magnitudes of peak negative current for −6 A, −12 A, and −18 A. Upon achieving the respective magnitude of peak negative current, the reversed negative current flow for each current profile line is released to zero for a period of time until the injector is commanded to open just after 1.00 ms or 2.00 ms. For fuel injection events having small quantities/masses of fuel to be delivered, the secondary hold current may not be necessary.

Figure 6:
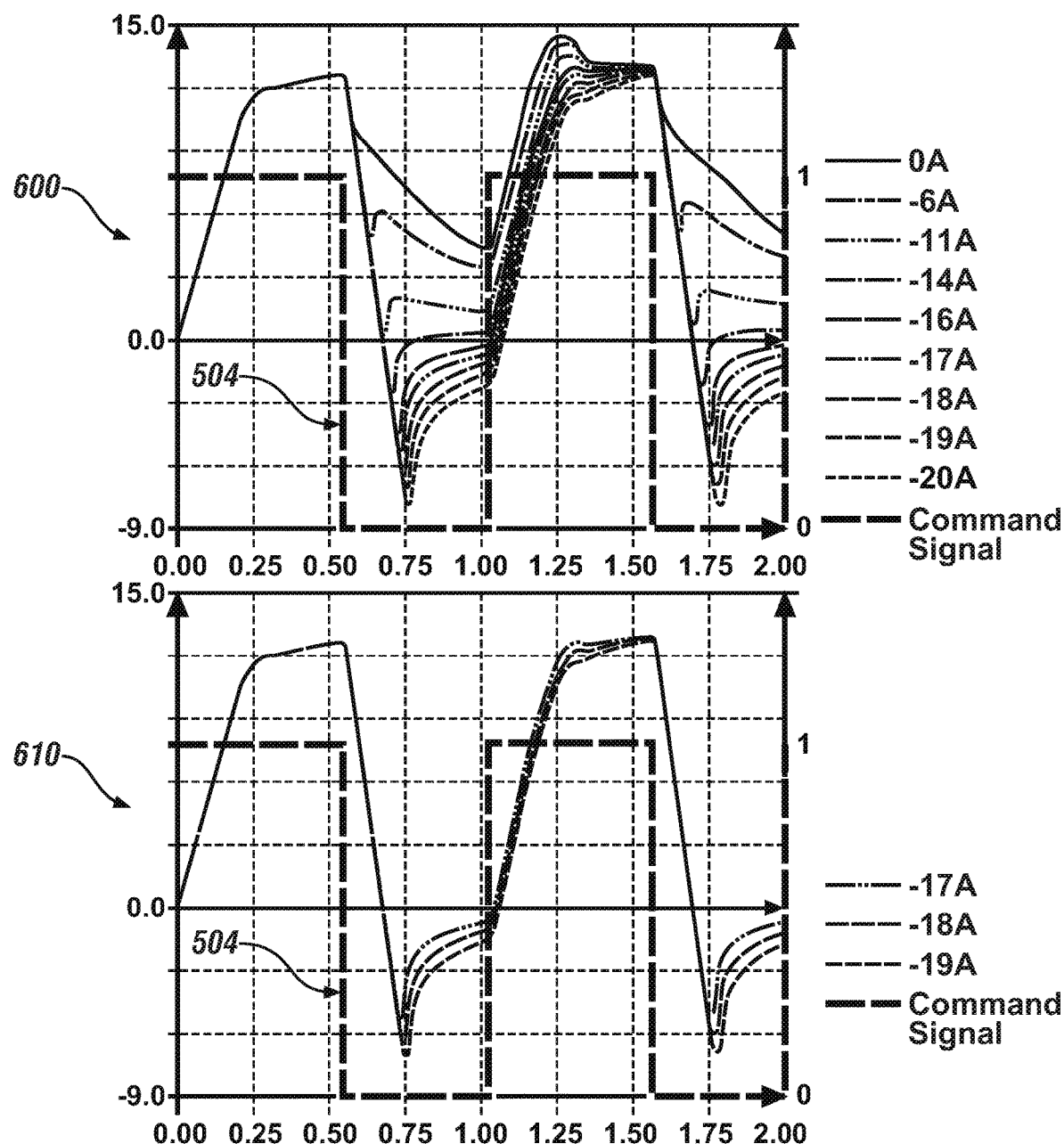
FIG. 6 illustrates non-limiting exemplary plots 600 and 610 of simulated magnetic flux and injector commands for corresponding ones of the plurality of optimum current waveforms for the two successive fuel injection events of the non-limiting exemplary plot 500 of FIG. 5, in accordance with the present disclosure.

FIG. 6 illustrates non-limiting exemplary plots 600 and 610 of magnetic flux and injector commands for corresponding ones of the plurality of optimum current waveforms for the two successive fuel injection events of the non-limiting exemplary plot 500 of FIG. 5, in accordance with the present disclosure. A plurality of magnetic flux profile lines, each responsive to a corresponding one of the different magnitudes of negative peak current of the non-limiting exemplary plot 500 of FIG. 5, represent the simulated magnetic flux of the electrical coil 24 of FIG. 1-1. The injector command profile line 504 represents the injector open and close commands of the non-limiting exemplary plot 500 of FIG. 5 is depicted. The horizontal x-axis in each of plots 600 and 610 denotes time in milliseconds (ms). The left-side vertical y-axis in each of plots 600 and 610 denotes magnetic flux in milliweber (mWb) of the electrical coil 24 and the right-side vertical y-axis in each of plots 600 and 610 denotes the injector command, whereat the fuel injector is commanded to close at "0" and commanded to open at "1".

Referring to plot 600, the magnitude and polarity of magnetic flux presence deviates for each of the corresponding magnitudes of negative peak current after the injector closing command for the two fuel injection events. Specifically, a relationship is depicted wherein the presence of magnetic flux after the injector closing command increases as the magnitude of negative peak current decreases. The presence of magnetic flux (e.g., residual flux) after the first fuel injection event undesirably results in the magnetic flux to deviate from desired values during the second fuel injection event while the injector is commanded to open. For instance, the presence of positive magnetic flux (e.g., residual flux) when a subsequent fuel injection event is initiated, may undesirably result in a higher than desired injected fuel mass to be delivered during the subsequent fuel injection event due to excessive rebound of the armature when the injector is commanded to close. Generally, as the magnitude of negative peak current increases, the occurrence of armature rebound after the injector closing command is reduced. Yet, in instances when the presence of negative magnetic flux includes extremely high magnitudes, undesirable levels of armature rebound may occur after the injector closing command. However, the presence of negative magnetic flux is effective to desirably extinguish positive magnetic flux inside the fuel injector after the injector closing command that would result without the negative peak current, to enable acceptable repeatability for closely spaced multiple fuel injection events. Accordingly, it is desirable to include magnitudes of negative peak current that result in a presence of negative magnetic flux with magnitudes that will not result in undesirable levels of armature rebound after the injector closing command Ideally, the magnetic flux profiles should be the same for each of the first and second fuel injection events to achieve stable and identical injected fuel mass delivery when the optimum current waveforms for each of the first and second fuel injection events are identical.

Referring to plot 610, magnetic flux profile lines responsive to corresponding ones of the magnitudes of peak negative current for −17 A, −18 A, and −19 A of plot 600 are depicted. As desired, the magnetic flux profile lines are substantially similar for each of the first and second fuel injection events during injector opening commands and achieve a desirable magnitude of negative magnetic flux after the injector closing times. Accordingly, magnetic flux profile lines, responsive to corresponding ones of the magnitudes of peak negative current for −17 A, −18 A, and −19 A, effectively extinguish magnetic flux present within the fuel injector rapidly after injector closing commands without causing undesirable levels of armature rebound to occur.

Figure 7:
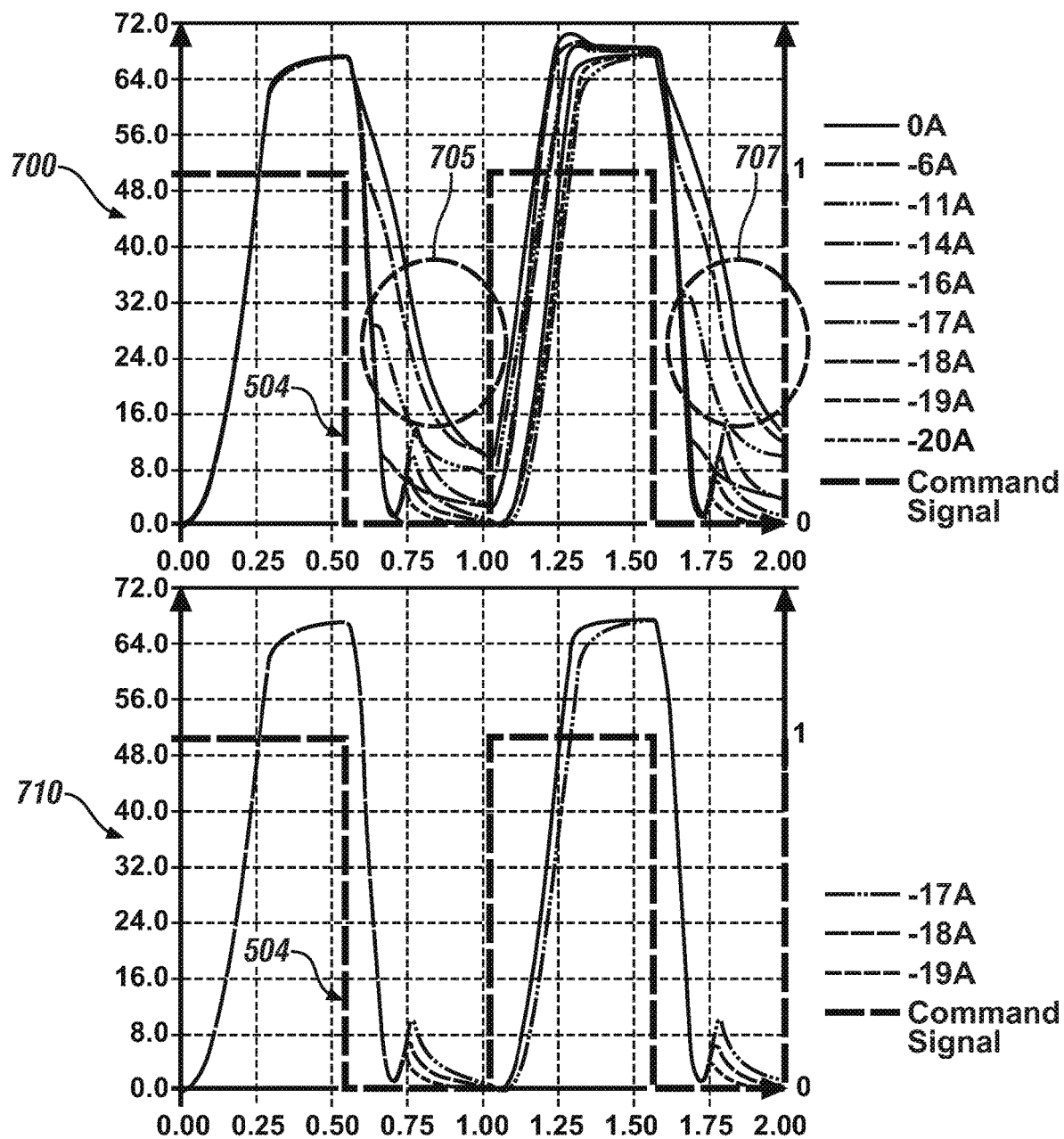
FIG. 7 illustrates non-limiting exemplary plots 700 and 710 of simulated armature force and injector commands for corresponding ones of the plurality of optimum current waveforms for the two successive fuel injection events of the non-limiting exemplary plot 500 of FIG. 5, in accordance with the present disclosure.

FIG. 7 illustrates non-limiting exemplary plots 700 and 710 of simulated armature force and injector commands for corresponding ones of the plurality of optimum current waveforms for the two successive fuel injection events of the non-limiting exemplary plot 500 of FIG. 5, in accordance with the present disclosure. As used herein, the term "armature force" refers to the magnetic force that the acts on the armature portion 21 to overcome the spring force exerted by the spring 26 and urges the valve assembly 18 in the second direction 82, as described above with reference to the non-limiting exemplary embodiment of FIG. 1-1. A plurality of armature force profile lines, each responsive to a corresponding one of the different magnitudes of negative peak current of the non-limiting exemplary plot 500 of FIG. 5, represent the simulated armature force exerted upon the armature portion 21 in the second direction 82 of FIG. 1-1. The injector command profile line 504 represents the injector open and close commands of the non-limiting exemplary plot 500 of FIG. 5 is depicted. The horizontal x-axis in each of plots 700 and 710 denotes time in milliseconds (ms). The left-side vertical y-axis in each of plots 700 and 710 denotes armature force in Newton (N) and the right-side vertical y-axis in each of plots 700 and 710 denotes the injector command, whereat the fuel injector is commanded to close at "0" and commanded to open at "1".

Referring to plot 700, a relationship is depicted within areas 705 and 707 whereat the response time for armature force to decrease toward zero after the injector closing command increases (e.g., is slower) as the magnitude of negative peak current decreases. It will be appreciated that that the armature force profiles indicative of slower armature response times after injector closing commands correspond to magnetic flux profile lines indicative of positive magnetic flux present after injector closing, as illustrated in the non-limiting plot 600 of FIG. 6. As the response time for armature force to decrease toward zero after the injector closing command for the first fuel injection event increases, the armature force increases in magnitude during the injector opening command of the second fuel injection event which can result in a higher than desired injected fuel mass to be injected during the second fuel injection event. Additionally, armature force profile lines with slow response times can result in undesirable armature rebound after the injector closing command that may result in unintended injector opening. Moreover, for magnitudes of negative peak current with higher magnitudes, e.g., −16 A to −20 A, the response time for armature force to quickly decrease toward zero is fast but may exhibit some rebound in magnetic force during the injector closing commands. The magnitude of the rebound in armature force increases as the corresponding magnitude of negative peak current increases. If this rebound is too high, undesirable levels of armature rebound or bounce can occur which may cause the armature to contact that pintle, whereat unintended opening of the fuel injector may occur.

Referring to plot 710, armature force profile lines responsive to corresponding ones of the magnitudes of peak negative current for −17 A, −18 A, and −19 A of plot 700 are depicted. As desired, the illustrated armature force profile lines are substantially similar for each of the first and second fuel injection events during injector opening commands Plot 710 illustrates that the armature force profile lines corresponding to the magnitudes of peak negative current for −17 A and −18 A, result in no armature force rebound after injector closing commands Plot 710 further illustrates that the armature force profile line corresponding to the magnitude of peak negative current for −19 A, results in some magnitude of armature force after the injector closing commands; however, the magnitude of armature force is not great enough to cause the position of armature to move into contact with the pintle (e.g., pintle 22 of FIG. 1-1) and cause unintended opening of the fuel injector. Accordingly, the magnitude of armature force depicted by the profile line corresponding to the magnitude of peak negative current for −19 A, is not indicative of undesirable armature force causing undesirable armature rebound or bounce.

Figure 8:
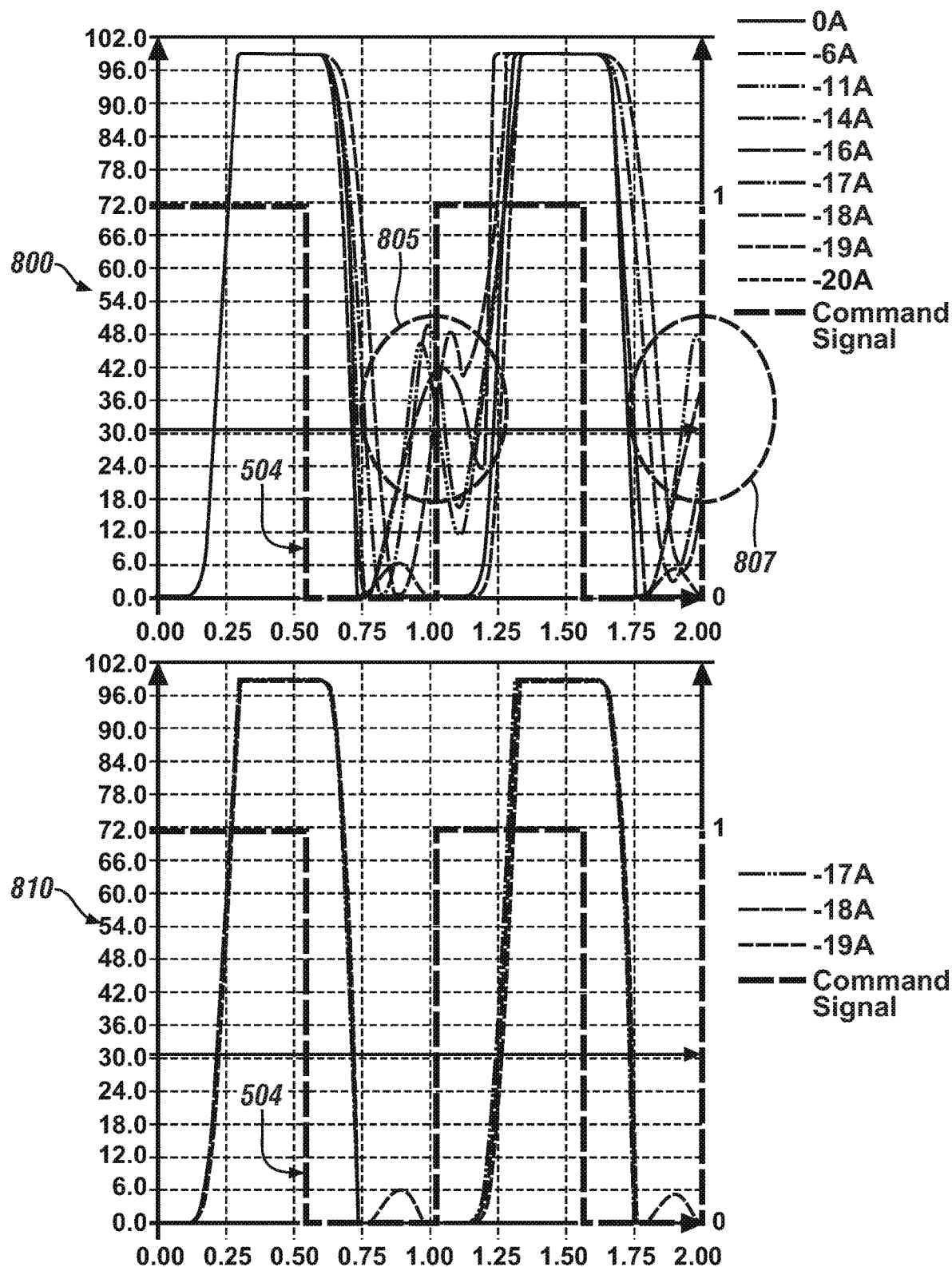
FIG. 8 illustrates non-limiting exemplary plots 800 and 810 of simulated armature position and injector commands for corresponding ones of the plurality of optimum current waveforms for the two successive fuel injection events of the non-limiting exemplary plot 500 of FIG. 5, in accordance with the present disclosure.

FIG. 8 illustrates non-limiting exemplary plots 800 and 810 of simulated armature position and injector commands for corresponding ones of the plurality of optimum current waveforms for the two successive fuel injection events of the non-limiting exemplary plot 500 of FIG. 5, in accordance with the present disclosure. A plurality of armature position profile lines, each responsive to a corresponding one of the different magnitudes of negative peak current of the non-limiting exemplary plot 500 of FIG. 5, represent the simulated armature position of the armature portion 21. The injector command profile line 504 represents the injector open and close commands of the non-limiting exemplary plot 500 of FIG. 5 is depicted. The horizontal x-axis in each of plots 800 and 810 denotes time in milliseconds (ms). The left-side vertical y-axis in each of plots 800 and 810 denotes armature position in microns, where at the armature portion 22 of FIG. 1-1 translates in the second direction 82 as the armature position increases from zero. The right-side vertical y-axis in each of plots 800 and 810 denotes the injector command, whereat the fuel injector is commanded to close at "0" and commanded to open at "1".

Referring to plot 800, a relationship is depicted within areas 805 and 807 whereat the armature position is indicative of undesirable armature rebound after the injector closing command that may result in unintended opening of the fuel injector. It will be appreciated that that the armature position profiles indicative of undesirable rebound after the injector closing correspond to armature force profile lines indicative of slow response times within areas 705 and 707 or high degrees of armature force rebound after injector closing, as illustrated in the non-limiting plot 700 of FIG. 7.

Referring to plot 810, armature position profile lines responsive to corresponding ones of the magnitudes of peak negative current for −17 A, −18 A, and −19 A of plot 800 are depicted. As desired, the illustrated armature position profile lines are substantially similar for each of the first and second fuel injection events during injector opening commands Plot 810 illustrates that the armature position profile lines corresponding to the magnitudes of peak negative current for −17 A and −18 A, result in no armature rebound after injector closing commands Plot 810 further illustrates that the armature position profile line corresponding to the magnitude of peak negative current for −19 A, results in some magnitude of armature rebound after injector closing; however, the magnitude of armature rebound is not great enough to contact the pintle (e.g., pintle 22 of FIG. 1-1) and cause unintended opening of the fuel injector. Accordingly, the magnitude of armature rebound depicted by the profile line corresponding to the magnitude of peak negative current for −19 A, is not indicative of undesirable armature rebound. Therefore, armature position profile lines responsive to corresponding ones of the magnitudes of peak negative current for −17 A, −18 A, and −19 A do not result in the occurrence of unintended armature bounce after injector closing commands, and therefore prevent unintended opening of the fuel injector 10 while rapidly resetting the presence of residual magnetic flux after injector closing commands.

Figure 9:
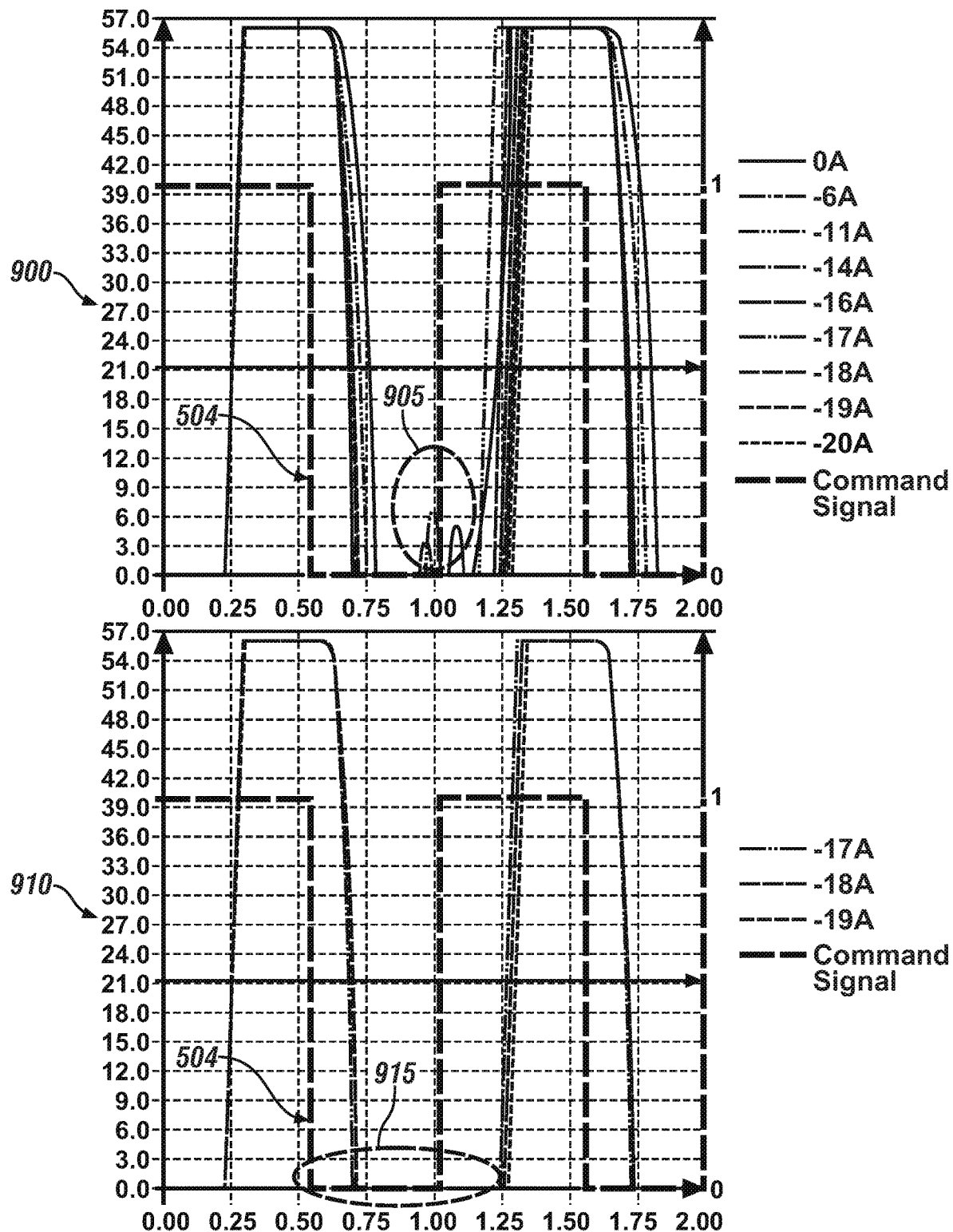
FIG. 9 illustrates non-limiting exemplary plots 900 and 910 of simulated pintle position and injector commands for corresponding ones of the plurality of optimum current waveforms for the two successive fuel injection events of the non-limiting exemplary plot 500 of FIG. 5, in accordance with the present disclosure.

FIG. 9 illustrates non-limiting exemplary plots 900 and 910 of simulated pintle position and injector commands for corresponding ones of the plurality of optimum current waveforms for the two successive fuel injection events of the non-limiting exemplary plot 500 of FIG. 5, in accordance with the present disclosure. A plurality of pintle position profile lines, each responsive to a corresponding one of the different magnitudes of negative peak current of the non-limiting exemplary plot 500 of FIG. 5, represent the simulated pintle position of the pintle 22 of FIG. 1-1. The injector command profile line 504 represents the injector open and close commands of the non-limiting exemplary plot 500 of FIG. 5 is depicted. The horizontal x-axis in each of plots 900 and 910 denotes time in milliseconds (ms). The left-side vertical y-axis in each of plots 900 and 910 denotes armature position in microns, whereat the pintle 22 of FIG. 1-1 translates in the second direction 82 while in contact with the armature portion 21 as the pintle position increases from zero. When the pintle position is zero, the fuel injector is closed. When the pintle position is greater than zero, the fuel injector is open and delivering fuel. The right-side vertical y-axis in each of plots 900 and 910 denotes the injector command, whereat the fuel injector is commanded to close at "0" and commanded to open at "1".

Referring to plot 900, a relationship is depicted within area 905 whereat the pintle position is greater than zero and indicative of an unintended open fuel injector. Moreover, some of the pintle position profiles of the second fuel injection event begin to increase earlier and remain greater than zero for a longer duration than corresponding pintle position profiles of the first fuel injection event. As a result of this deviation in the second fuel injection event, higher than desired magnitudes of injected fuel mass are delivered during the second fuel injection event.

Referring to plot 910, pintle position profile lines responsive to corresponding ones of the magnitudes of peak negative current for −17 A, −18 A, and −19 A of plot 900 are depicted. As desired, the illustrated pintle position profile lines are substantially similar for each of the first and second fuel injection events during injector opening commands resulting in consistent and stable fuel delivery. Within area 915, plot 910 illustrates that the pintle position profile lines corresponding to the magnitudes of peak negative current for −17 A, −18 A and 19 A, include pintle positions of zero during the dwell time between the first and second fuel injection events. Accordingly, pintle position profile lines responsive to corresponding ones of the magnitudes of peak negative current for −17 A, −18 A, and −19 A do not result in pintle positions greater than zero between the first and second fuel injection events, and therefore, prevent unintended opening of the fuel injector 10 during the dwell time between the first and second fuel injection events while rapidly resetting the presence of residual magnetic flux after injector closing commands. Moreover, pintle position profile lines responsive to corresponding ones of the magnitudes of peak negative current for −17 A, −18 A, and −19 A, further result in pintle positions for the second fuel injection event that are substantially similar to the corresponding pintle positions of the first fuel injection event, and therefore, result in consistent and stable fuel delivery for the first and second fuel injection events that are closely spaced.

Figure 10:
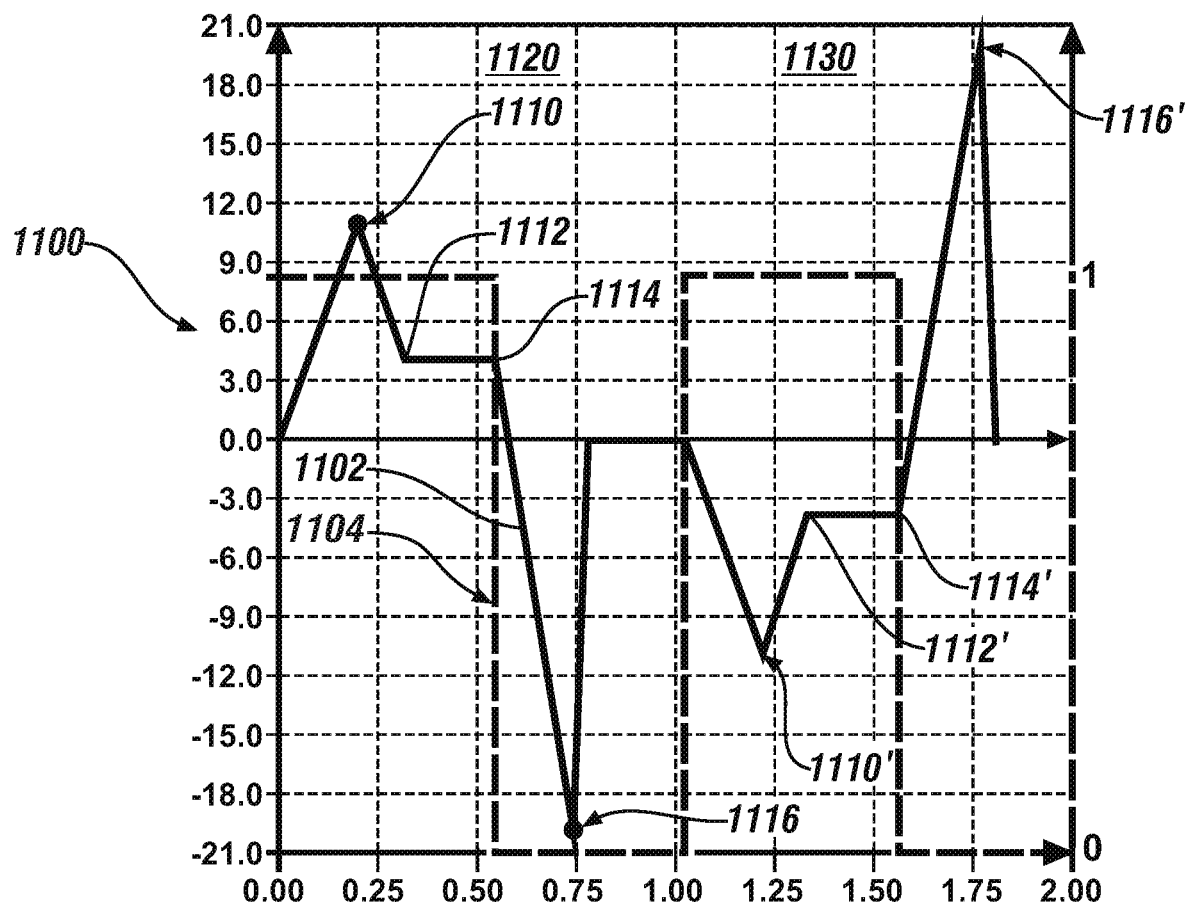

FIG. 10 illustrates a non-limiting exemplary plot 1100 of simulated current and injector commands for two successive fuel injection events having optimum current waveforms alternating in polarity, in accordance with the present disclosure. In the illustrated embodiment, the fuel injection events are separated by a dwell time that is indicative of being closely spaced. Current profile line 1102 represents the simulated current through the electrical coil 24 of FIG. 1-1 and injector command profile line 1104 represents either an injector open command or an injector close command. The horizontal x-axis denotes time in milliseconds (ms). The left-side vertical y-axis denotes current in Amperage (A) and the right-side vertical y-axis denotes the injector command, whereat the fuel injector is commanded to close at "0" and commanded to open at "1".

The optimum current waveform for the first fuel injection event is illustrated within region 1120 and the optimum current waveform for the second fuel injection event is illustrated within region 1130 of plot 1100. The polarity of the optimum current waveform for the first fuel injection event alternates to a reversed polarity for the second fuel injection event.

With respect to the optimum current waveform for the first fuel injection event within region 1120, the current profile line 1102 increases from zero to a peak pull-in current at point 1110 and is reduced to a secondary hold current between points 1112 and 1114 in response to the injector open command at 0 ms. In response to the injector close command just after 0.50 ms, the secondary hold current is released to zero after point 1114 and the electrical current flow through the electrical coil 24 is reversed in the negative direction until achieving a negative peak current at point 1116. Upon achieving the negative peak current at point 1116, the reversed negative current flow is released to zero at about 0.75 ms for a period of time until the injector is commanded to open just after 1.00 ms, whereat the injector is commanded to open to initiate the second fuel injection.

With respect to the reversed polarity optimum current waveform for the second fuel injection event within region 1130, the current flow through the electrical coil 24 is reversed in the negative direction whereat the current profile line 1102 decreases from zero to a negative peak pull-in current at point 1110' and is released to a secondary negative hold current between points 1112' and 1114' in response to the injector open command just after 1.00 ms. In response to the injector close command just after 1.50 ms, the secondary negative hold current is released to zero after point 1114' and the electrical current flow through the electrical coil 24 is reversed in the positive direction until achieving a positive peak current at point 1116'. Upon achieving the positive peak current at point 1116', the reversed positive current flow is released to zero just after 1.75 ms for a period of time until the injector is commanded to open at about 2.00 ms, whereat the injector may be commanded to open to initiate a third fuel injector event whereat the polarity of the optimum current waveform will be alternated to a polarity identical to the first fuel injection event and reversed from the second fuel injection event.

It will be appreciated that the optimum current profiles for the first and second fuel injection events within the regions 1120, 1130, respectively, are identical except that the polarity of the current profile line 1104 is reversed. For instance, the peak pull-in current at point 1110 includes an identical magnitude of current as the negative peak pull-in current at point 1110'; the secondary hold current between points 1112 and 1114 includes an identical magnitude of current as the secondary negative hold current between points 1112' and 1114'; and the negative peak current at point 1116 includes an identical magnitude of current as the positive peak current at point 1116'. For fuel injection events having small quantities/masses of fuel to be delivered, the secondary hold current and the secondary negative hold current may not be necessary.

Alternating the polarity of the optimum current waveform for each successive fuel injection event from the polarity of the optimum current waveform for an immediately preceding fuel injection event eliminates the presence of undesirable residual flux within the fuel injector due to the magnetic hysteresis generated by the soft magnetic materials, e.g., stainless steel, of the fuel injector. Accordingly, the optimum current waveforms each include current applied to the electrical coil 24 bi-directionally, wherein the optimum current waveforms for successive fuel injection events are bi-directional in polarity with respect to one another.

In the illustrated non-limiting exemplary plot 1100, a magnitude of the negative peak current 1116 (positive peak current 1116') for the first (second) fuel injection event is greater than a magnitude of the corresponding peak pull-in current 1110 (negative peak pull-in current 1110'). For instance the peak pull-in current 1110 (negative peak pull-in current 1110') is at around 11.0 A (−11.0 A) and the negative peak current 1116 (positive peak current 1116') is at or around −17.0 A (17.0 A); however embodiments herein are not limited to any explicit magnitudes for the peak pull-in (negative peak pull-in) and negative peak (positive peak) currents. The magnitude and slope of the negative and positive peak currents can be selected based upon functions of commanded injector opening times, desired injected fuel mass to be delivered, dwell time, corresponding pull-in current when the injector is commanded open, as described above with reference to the non-limiting exemplary plot 400 of FIG. 4.

The disclosure has described certain preferred embodiments and modifications thereto. Further modifications and alterations may occur to others upon reading and understanding the specification. Therefore, it is intended that the disclosure not be limited to the particular embodiment(s) disclosed as the best mode contemplated for carrying out this disclosure, but that the disclosure will include all embodiments falling within the scope of the appended claims.

The invention claimed is:

1. A method for operating an electromagnetic actuator, comprising:
an actuation event utilizing a current waveform for the actuator characterized by
an initial peak pull-in current in a first direction of current flow when the actuator is commanded to an actuated position; and
a reversed peak current in a second opposite direction of current flow applied after the actuator is commanded to a rest position, the reversed peak current having a magnitude that is greater than the magnitude of the initial peak pull-in current;
wherein the magnitude of the reversed peak current is determined as a function of a dwell time before a subsequent actuation event; and
wherein the dwell time is greater than a dwell time threshold that is associated with producing deviations in the subsequent actuation event.

2. The method of claim 1, wherein the current waveform is further characterized by a secondary hold current subsequent to the initial peak pull-in current, the secondary hold current having a magnitude sufficient to maintain the actuator in an actuated position.

3. The method of claim 2, wherein the reversed peak current is applied only after the secondary hold current is released.

4. The method of claim 1, wherein the magnitude of the reversed peak current is determined as a function of a commanded actuation time of the actuator.

5. The method of claim 1, wherein the reversed peak current has a rate of increasing magnitude determined as a function of the peak pull-in current.

6. The method of claim 1, wherein the reversed peak current has a rate of decreasing magnitude determined as a function of the peak pull-in current.

7. The method of claim 1, wherein the current waveform is further characterized by the reversed peak current being released to zero for a duration prior to a subsequent actuation event.

8. The method of claim 1, wherein the reversed peak current results in a residual magnetic flux in the actuator having an opposite polarity to a passive residual magnetic flux present in the actuator following the actuation event.

9. A method for operating a solenoid-activated fuel injector, comprising:
a fuel injection event utilizing a current waveform for the fuel injector characterized by an initial peak pull-in current in a first direction of current flow when the injector is commanded to open; and
a reversed peak current in a second opposite direction of current flow applied after the injector is commanded to close, the reversed peak current having a magnitude that is greater than the magnitude of the initial peak pull-in current;
wherein the magnitude of the reversed peak current is determined as a function of a dwell time before a subsequent actuation event; and
wherein the dwell time is greater than a dwell time threshold that is associated with producing deviations in a magnitude of injected fuel mass delivered in the subsequent actuation event.

10. The method of claim 9, wherein the current waveform is further characterized by a secondary hold current subsequent to the initial peak pull-in current the secondary hold current having a magnitude sufficient to maintain the fuel injector in an open position.

11. The method of claim 10, wherein the secondary hold current is utilized when the initial peak pull-in current is insufficient for delivering a desired small injected fuel mass.

12. The method of claim 9, wherein the magnitude of the reversed peak current is determined as a function of a commanded opening time of the fuel injector.

13. The method of claim 9, wherein the magnitude of the reversed peak current is determined as a function of a desired injected fuel mass to be delivered when the injected fuel mass is less than a predetermined value.

14. The method of claim 9, wherein the reversed peak current has a rate of increasing magnitude determined as a function of the peak pull-in current.

15. The method of claim 9, wherein the reversed peak current has a rate of decreasing magnitude determined as a function of the peak pull-in current.

16. Apparatus for operation of a solenoid-activated fuel injector, comprising:
an electromagnetic fuel injector, comprising:
an electrical coil; and
an armature portion;
an injector driver configured to drive current into the electrical coil in a first direction to activate the fuel injector and subsequently drive current into the electrical coil in a second direction, wherein the current driven in the second direction has a magnitude that is greater than the magnitude of the current driven in the first direction;
wherein the magnitude of the current driven in the second direction is determined as a function of a dwell time before a subsequent actuation event; and
wherein the dwell time is greater than a dwell time threshold that is associated with producing deviations in a magnitude of injected fuel mass delivered in the subsequent actuation event.

17. The method of claim 1, wherein a slope of the reversed peak current is determined as a function of the peak pull-in current.

* * * * *